United States Patent [19]
Bassett et al.

[11] Patent Number: 5,145,763
[45] Date of Patent: Sep. 8, 1992

[54] POSITIVE PHOTORESIST COMPOSITION

[75] Inventors: David R. Bassett, Charleston, W. Va.; Gary A. Amstutz, San Jose, Calif.

[73] Assignee: OCG Microelectronic Materials, Inc., Cheshire, Conn.

[21] Appl. No.: 545,702

[22] Filed: Jun. 29, 1990

[51] Int. Cl.$^5$ .................. G03C 1/54; G03F 7/022
[52] U.S. Cl. .................... 430/169; 430/190; 430/191; 430/192; 430/193
[58] Field of Search ............... 430/190, 191, 192, 193, 430/169

[56] References Cited

U.S. PATENT DOCUMENTS

| | | | |
|---|---|---|---|
| 3,046,120 | 7/1962 | Schmidt et al. | 430/190 |
| 3,666,473 | 7/1972 | Colom et al. | 430/192 |
| 3,859,099 | 1/1975 | Petropoulos et al. | 430/190 |
| 3,868,254 | 2/1975 | Wemmers | 430/165 |
| 4,173,470 | 6/1979 | Fahrenholtz et al. | 430/5 |
| 4,308,368 | 12/1981 | Kubo et al. | 525/504 |
| 4,365,019 | 12/1982 | Daly et al. | 430/190 |
| 4,377,631 | 3/1983 | Toukhy et al. | 430/192 |
| 4,424,270 | 1/1984 | Erdmann et al. | 430/166 |
| 4,460,674 | 9/1984 | Uehara et al. | 430/190 |
| 4,555,469 | 11/1985 | Erdmann et al. | 430/168 |
| 4,587,196 | 5/1986 | Toukhy | 430/192 |
| 4,684,597 | 8/1987 | Lussier | 430/190 |
| 4,696,891 | 9/1987 | Guzzi | 430/191 |
| 4,812,551 | 3/1989 | Oi et al. | 430/193 |
| 4,975,351 | 12/1990 | Akaki et al. | 430/190 |
| 4,997,742 | 3/1991 | Covington et al. | 430/192 |

FOREIGN PATENT DOCUMENTS

| | | | |
|---|---|---|---|
| 0330239 | 8/1989 | European Pat. Off. | |
| 2541982 | 3/1977 | Fed. Rep. of Germany | 430/191 |
| 9001726 | 2/1990 | PCT Int'l Appl. | 430/190 |
| 1442934 | 7/1976 | United Kingdom | 430/191 |

OTHER PUBLICATIONS

Research Disclosure No. 242, Jun. 1984, Havant GB p. 240.

Primary Examiner—Charles L. Bowers, Jr.
Assistant Examiner—Mark F. Huff
Attorney, Agent, or Firm—William A. Simons

[57] ABSTRACT

A positive photoresist composition containing (i) a quinone diazide polymer formed by reacting a cresol-formaldehyde novolac resin and an o-quinonediazide compound, and (ii) a sulfonamide development enhancement agent.

37 Claims, 1 Drawing Sheet

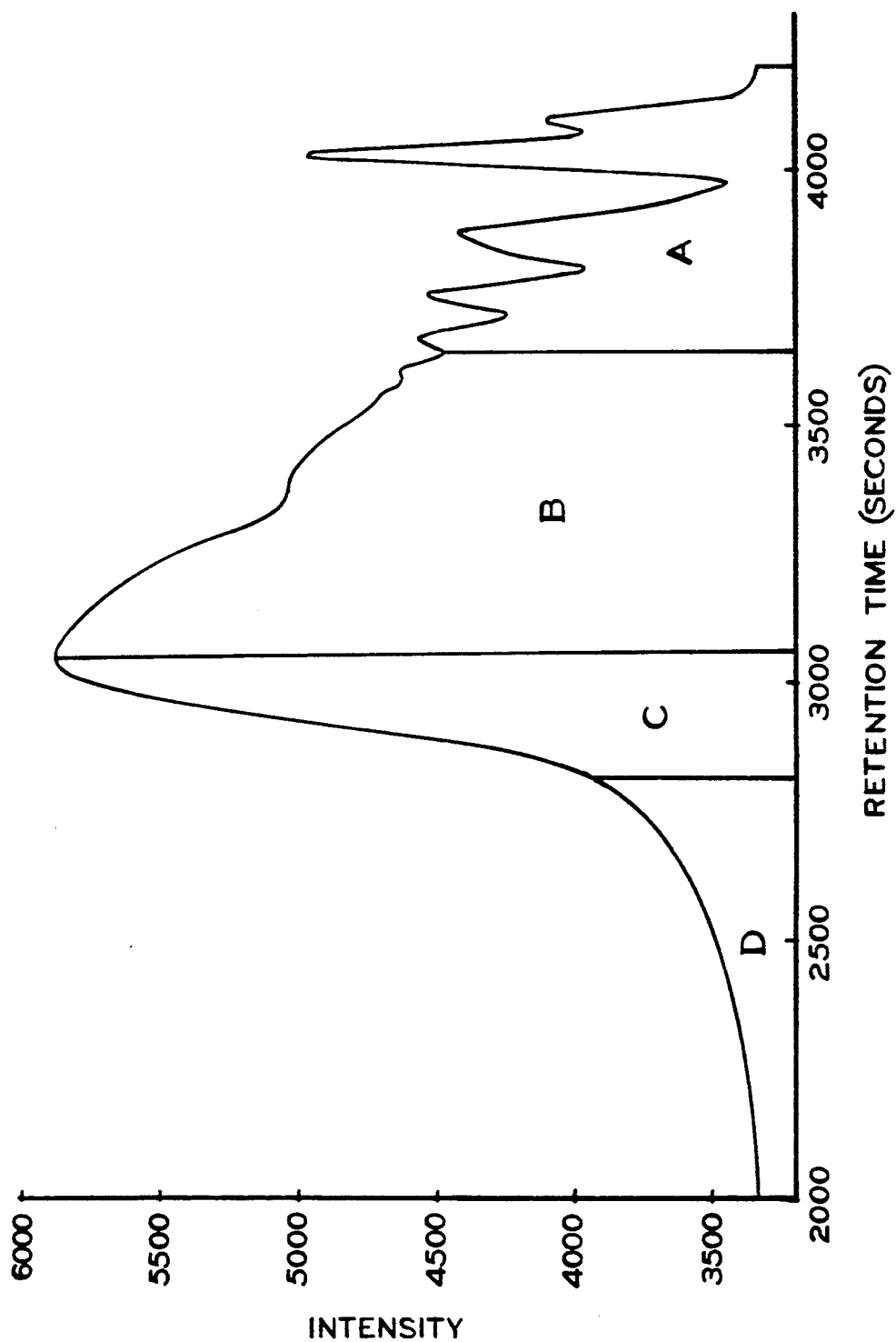

POSITIVE PHOTORESIST COMPOSITION

BACKGROUND OF THE INVENTION

1. Field of the Invention

The present invention is directed to improved light-sensitive positive photoresist compositions containing a quinonediazide polymer comprising the reaction product of a cresol-formaldehyde novolac resin and an o-quinonediazido compound (hereinafter referred to alternatively as "a modified novolac resin") and particularly to photoresist compositions containing a mixture of the quinonediazide polymer and a sulfonamide development enhancement agent.

2. Description of Related Art

Photoresist compositions are used in microlithography processes for making miniaturized electronic components such as in the fabrication of integrated circuits and printed wiring board circuitry. Generally, in these processes, a thin coating or film of a solution of the photoresist composition is first applied to a substrate material, such as silicon wafers used for making integrated circuits or aluminum or copper plates for printed wiring boards. The coated substrate then is baked to remove solvent and fix the coating onto the substrate.

The baked, coated surface of the substrate next is subjected to an image-wise exposure of radiation. This radiation exposure causes a chemical transformation in the exposed areas of the coated surface. Ultraviolet (UV) light and electron beam energy are radiation sources commonly used today in microlithographic processes. After this image-wise exposure, the coated substrate is treated with a developer solution to dissolve and remove either the radiation-exposed or the unexposed areas of the coated surface of the substrate.

There are two types of photoresist compositions: negative-working and positive-working. When negative-working photoresist compositions are exposed to radiation, the exposed areas of the resist composition become insoluble to a developer solution (e.g. a crosslinking reaction occurs), while the unexposed areas of the photoresist coating remain soluble. Thus, treatment of an exposed negative-working resist with developer removes non-exposed areas of the resist coating and creates a negative image in the photoresist coating. On the other hand, when positive-working photoresist compositions are exposed to radiation, those exposed areas of the resist composition become soluble to the developer solution (e.g. a decomposition reaction occurs), while those areas not exposed remain insoluble. Thus, treatment of an exposed positive-working resist with developer removes the exposed areas of the resist coating and creates a positive image in the photoresist coating.

After development, the partially unprotected substrate then is subjected to known subtractive or additive processes. For example, the substrate can be treated with a substrate-etchant solution, plasma gases or the like. Etchant solution or plasma gas etches that portion of the substrate where the photoresist coating was previously removed during development. Areas of the substrate where the photoresist coating still remains are protected during such subtractive, and also additive, processing. Thus, in the subtractive example identified above an etched pattern is created in the substrate material which corresponds to the exposure image of the actinic radiation. Later, remaining areas of the photoresist coating are removed during a stripping operation, leaving a clean etched substrate surface. This process, interlaced with other processing steps, then may be repeated numerous times to form the desired structure in the substrate.

As noted, the relief pattern of photoresist on a substrate produced by the method described above is useful for various applications including, for example, as an exposure mask or a pattern such as is employed in the manufacture of miniaturized integrated electronic components. The ability of a resist to reproduce very small dimensions, on the order of a micron or less, is extremely important in the production or large scale integrated circuits on silicon chips and similar components. Circuit density on such a chip can only be increased, assuming photolithographic techniques are utilized, by increasing the resolution capabilities of the resist.

Positive-working photoresist compositions recently have been favored over negative-working photoresists because the former generally have had better resolution and pattern transfer characteristics. Photoresist resolution is the lower limit of geometrically equal line and space patterns which the resist composition can transfer from a photomask to a substrate with a high degree of image edge acuity after exposure and development.

Particularly, with integrated circuits, miniaturization has proceeded with a rise in the integration level resulting in a demand for the formation of submicron patterns. At one time, a mask contact printing method had been used predominately for the formation of integrated circuits, but the resolution limit of this method was only about 2 $\mu$m, and a reduction projection exposure method has since assumed a much larger use. This latter method involves reducing and projecting the pattern of a master mask (reticle) by passing light through a lens system. A submicron resolution can be obtained. This method has placed a much larger premium on photoresists which function at high resolution and over a relatively wide focus and exposure range. It also is highly desirable that the developed photoresist profile be nearly as vertical relative to the substrate surface as possible. Such demarcations between developed and undeveloped areas of the resist coating translate into more accurate pattern transfer of the mask image onto the substrate after etching. Improved processing latitude is particularly important where an intricate structure, formed by repeated exposures and etchings, is sought at the limits of miniaturization.

Several ingredients commonly make up positive photoresist compositions. A light stable, water-insoluble, alkali-soluble film-forming resin (or mixture of resins) is usually the major solid component. Phenol-formaldehyde novolacs, cresol-formaldehyde novolacs and poly(vinyl phenols) are well known examples of such resins. One or more light-sensitive compounds (also known as photoactive compounds or sensitizers) also are present in the photoresist composition. Naphthoquinonediazide compounds are examples of such sensitizers.

When a film is formed from the resin component, novolac resins are used most often, it is at least partially soluble in an aqueous alkaline developing solution. However, addition of the sensitizer inhibits dissolution of the film in the developing solution. When a substrate coated with a positive-working photoresist composition is subjected to an exposure of radiation, the sensitizer undergoes a radiation-induced chemical transformation in those exposed areas of the coating. This photochemical transformation eliminates the solubility-inhibiting property that the sensitizer had on the film-forming resin in alkaline developers. Accordingly, the radiation-exposed areas of the coating are now more soluble to aqueous alkaline developing solutions than the unexposed areas. The difference in solubility causes the exposed areas of the photoresist coating to dissolve when the coated substrate is immersed in the aqueous alkaline developing solution while the unexposed areas are largely unaffected, thus producing a positive relief pattern on the substrate.

It also is known to employ in positive-working resists, a light sensitive polymer containing recurring groups with pendant quinone diazide groups that are light sensitive. U.S. Pat. No. 3,046,120 discloses a polymer prepared by the condensation of o-benzoquinonediazido sulfonylchloride or o-naphthoquinonediazo sulfonylchloride with an alkali-soluble phenol-formaldehyde resin of the novolac type, or o- or m-cresol-formaldehyde resin. Another photosensitive polymer which has enjoyed wide use is the condensation product of a phenol-formaldehyde or cresol-formaldehyde resin and 1,2-diazo -5 sulfonate-naphthoquinone, capped with about 3-15 weight % of the naphthoquinonediazide. Unfortunately, when metal ion free developers are used to develop the exposed image, this photosensitive polymer tends to scum. Scumming involves a variety of observed phenomena that are characterized by an incomplete removal of the exposed resist film. Scumming is unacceptable in the fabrication of integrated circuits and printed wiring board circuitry. Such polymer compositions also have been used in resist compositions in combination with photoactive dissolution cohibitors (monomers) whose function is to thermally crosslink the polymer in non-exposed regions of the resist. Examples of such photoactive dissolution inhibitors are mentioned in U.S. Pat. No. 4,365,019 where a 1,3,5-trihydroxybenzene esterified with 1,2-naphthoquinonediazide sulfonic acid is disclosed and U.S. Pat. No. 4,684,597, where a 1,2,4-trihydroxybenzene esterified with a 1,2-naphthoquinonediazide sulfonic acid is disclosed.

U.S. Pat. No. 4,308,368 also describes a resist composition containing an adduct of a co-condensed novolac resin and a photosensitive o-quinonediazido compound. The novolac resin is prepared by reacting formaldehyde with phenol or cresol and a phenol substituted with an alkyl group having 3 to 12 carbon atoms or a phenyl group.

Positive-working photoresist compositions preferably contain other ingredients besides the film-forming resin and sensitizer. For example, one or more solvents may be added to facilitate application of the photoresist composition onto the substrate. Ethyl lactate, ethylene glycol methyl ether acetate, propylene glycol methyl ether acetate, N-methyl-2-pyrrolidone, and mixtures of cellosolve acetate, butyl acetate and xylenes are examples of commonly used solvents. The resin and sensitizer are dissolved in the solvent or solvents to facilitate their application (coating) to the substrate. Subsequent drying (baking) of the resist-coated substrate removes most of the solvent.

Other preferred photoresist additives include actinic and contrast dyes, anti-striation agents, plasticizers, speed enhancers and the like. Actinic dyes help provide increased resolution by inhibiting back scattering of light off the substrate. This back scattering causes the undesirable effect of optical notching, especially where the substrate surface is highly reflective or has topography. Contrast dyes enhance the visibility of developed images and may be used to facilitate pattern alignment during manufacturing. Anti-striation agents level out the photoresist coating or film to a uniform thickness. This is important to ensure uniform radiation exposure over the film surface. Plasticizers improve the coating and adhesion properties of the photoresist composition and better allow for the application of a thin coating or film of photoresist which is smooth and of uniform thickness onto the substrate. Speed enhancers generally tend to increase the solubility of the photoresist coating in both the exposed and unexposed areas. Thus, speed enhancers often are used in applications where speed of development is the overriding consideration even though some degree of contrast may be sacrificed, i.e. while the exposed areas of the photoresist coating will be dissolved more quickly by the developer, the speed enhancers will also cause a larger loss of photoresist coating from the unexposed areas.

The present invention overcomes many of the drawbacks of conventional photosensitive compositions of the type described in the prior art. The resist compositions of the present invention can be developed with metal ion free developers while avoiding scumming, exhibit excellent bleaching characteristics, and provide high contrast, high resolution and vertical sidewalls by retaining high resistance to aqueous alkali solutions over the unexposed area. The resist compositions simultaneously exhibit improved processing latitude, e.g. excellent focus and exposure latitude, with very small mask bias and excellent latent image stability. This reduces the effects on the resist composition of unavoidable process variations, resulting in more predictable critical dimensions and higher yields of high quality submicron devices. The resist compositions of the present invention also exhibit excellent plasma etch resistance.

BRIEF DESCRIPTION OF THE DRAWING

The sole Figure is a representative GPC pattern of the particular novolac resin defined by the present invention. The novolac resin serves a key role in improving the dimensional reproducibility of mask patterns prepared from the positive resist composition of the present invention, which is a key factor to obtaining increased resolution and improved processing latitude.

DETAILED DESCRIPTION

The present invention provides an improved light-sensitive positive photoresist composition which contains as an essential component a quinonediazide polymer or modified novolac resin formed by reaching (a) an alkali-soluble novolac resin prepared by a two step procedure comprising the condensation of a cresol and formaldehyde, followed by a chain growth reaction with hexamethylenetetramine and (b) an o-quinonediazido compound represented by formula (I)

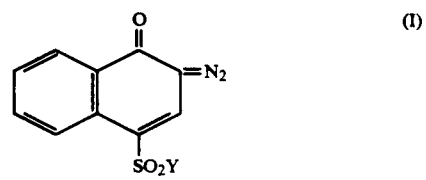

wherein Y constitutes a removable group.

The novolac resin used in preparing the modified novolac resin for use in the positive photoresist compositions of the present invention is a known resin and is produced by a two step reaction procedure. The first reaction step comprises an addition condensation reaction between cresol and formaldehyde and the second step comprises a chain growth/branching reaction with hexamethylenetetramine.

Ortho-, meta- or para-cresol may be used alone or in combination for reaction with formaldehyde in the first step of making the modified novolac resin. It is preferred to use meta-cresol alone or a meta-cresol/para-cresol mixture. In the latter case, a meta-cresol:para-cresol ratio is preferably between about 100:0 to 20:80, more preferably between about 100:0 to 80:20.

In the present invention, aqueous formaldehyde solution (formalin) or paraformaldehyde, which is an oligomer of formaldehyde, can be used in the initial addition condensation reaction with a cresol. For convenience, commercially available 37% formalin can be used.

The addition condensation reaction of cresol with formaldehyde is carried out under acidic reaction conditions according to the usual method. This reaction can be conducted at a temperature of from about 60° to 120° C. for from about 2 to 30 hours, with shorter times required at higher temperatures. Organic acids, inorganic acids or divalent metal salts can be used as the acid catalyst. Specifically, such acid catalysts include oxalic acid, hydrochloric acid, sulfuric acid, perchloric acid, p-toluenesulfonic acid, trichloroacetic acid, phosphoric acid, formic acid, zinc acetate, magnesium acetate, and the like. The acid catalyst is used in an amount typically employed for preparing novolac resins. Generally an amount between about 0.5 and 2.0 moles of the acid catalyst per 100 moles of cresol should be adequate.

The reaction may be carried out in any conventional condensation polymerization apparatus; a reactor equipped with an agitator, means for reflux and distillation, and conventional heat-exchange means is suitable. Normally, the formaldehyde is added slowly, while maintaining a constant temperature, to a mixture of cresol and acid catalyst.

The reaction may be carried out in bulk or in the presence of a suitable solvent. Suitable solvents include for example alcohols (e.g. methanol, ethanol, propanol), ketones (e.g. acetone, methyl ethyl ketone, methyl isobutyl ketone), ethylene glycol or its ethers and ether esters (e.g. ethyl cellosolve, ethyl cellosolve acetate), propylene glycol or its ethers and ether acetates), acetic acid esters (e.g. methyl acetate, ethyl acetate), xylenes, formamide, dimethylformamide, tetrahydrofuran, dioxane, dimethyl sulfoxide, acetonitrile, and the like. Preferably, a solvent which forms an azeotrope with water, produced as a by-product of the cresol-formaldehyde condensation reaction, is used.

Formaldehyde is used in an amount, relative to the cresol, such as p-cresol, o-cresol and m-cresol and their mixtures, of about 50 to 90 mole %, preferably about 60 to 85 mole %, and more preferably about 65 to 80 mole %.

Once the initial addition condensation reaction is complete, which can be monitored by a variety of procedures well known to those skilled in the art, such as by monitoring the refractive index of the reaction media, the temperature is gradually increased to remove essentially all volatile constituents, including any unreacted monomer. Preferably, such heating is followed by a vacuum stripping step to complete volatiles removal. The resin is then prepared for the second reaction step.

Preferably, in contemplation of the second reaction step, the resin is dissolved in the same solvent ultimately used in formulating the coating solution of the resist composition. Suitable solvents include ethyl cellosolve acetate, methyl cellosolve acetate, ethyl cellosolve, methyl cellosolve, propylene glycol monomethyl ether acetate, butyl acetate, methyl isobutyl ketone, xylene and the like. In accordance with the second reaction step, the resin is incrementally chain extended by a controlled reaction with hexamethylenetetramine to obtain a novolac resin of the desired molecular weight distribution. Normally, hexamethylenetetramine can be added in an amount between about 0.1 and 2.0 percent by weight of the amount of cresol originally used to prepare the novolac resin, more usually an amount between about 0.8 and 1.5 percent should be suitable. The hexamethylenetetramine typically is added using several separate additions, such as from about 2 to 7 additions, coupled with close monitoring of the molecular weight distribution to ensure that a resin of the desired configuration is obtained. The reaction is conveniently conducted at a temperature between about 120° to 160° C., e.g., at about 145° C., with about a one to 5 hour hold period between sequential additions of the hexamethylenetetramine.

The novolac resin has a particular molecular weight distribution which can be characterized by its gel permeation chromatographic pattern (GPC pattern). A preferred pattern is shown in the Figure. More generally, a resin suitable for the present invention will have a molecular weight distribution such that it exhibits a GPC pattern, measured by the use of a comparative refractive index detector relative to a tetrahydrofuran standard, having an area ratio (based on the sum of the areas being 100%) as follows: A range where the molecular weight range, calculated as polystyrene, is from about 200 to less than about 600 (not including cresol and other unreacted monomer) and constitutes from about 15 to about 25 area % of the GPC pattern (hereinafter referred to as region or range A), a range where the molecular weight calculated as polystyrene is from about 600 to less than about 4500 and constitutes from about 40 to about 65 area % of the GPC pattern (hereinafter referred to as region or range B), a range wherein the molecular weight calculated as polystyrene is from about 4500 to less than about 14500 and constitutes from about 10 to about 25 area % of the GPC pattern (hereinafter referred to as region or range C) and a range wherein the molecular weight calculated as polystyrene exceeds about 14500 and constitutes from about 2 to 10 area % (hereinafter referred to as region or range D) with a further constant that the ratio of the sum of regions A and B to the sum of the regions C and D is between about 2.0 and 4.0, preferably between about 2.5 and 3.5.

The term "the molecular weight of a novolac resin" referred to herein means a value obtained by gel permeation chromatography (herein referred to as GPC) with monodispersed polystyrene as a standard. The GPC chromatogram may be measured by connecting a Waters 150C GPC/ALC chromatograph with a set of five Waters Ultrastyragel GPC columns in series, ($10^4$ Å, $10^3$ Å, 500 Å and two 100 Å columns) and streaming, as the mobile phase, a tetrahydrofuran carrier solvent, at a flow rate of 0.64 ml/min. Chromatography was carried out using a comparative refractive index detector, with tetrahydrofuran as the comparison standard. When used throughout the specification and in the claims, the phrase "GPC pattern" and the like is defined as the gel permeation chromatography trace obtained on a resin using the previously described equipment and procedure. The molecular weight is obtained from a calibration curve prepared with monodispersed polystyrene. The calibration curve was prepared by third order regression using eleven (11) monodispersed polystyrene standards of which the weight average molecular weight spanned the range of 2,000 to 3,000,000.

The novel quinonediazide polymer (modified novolac) according to this invention then is prepared by the reaction (condensation) of the above prepared novolac resin with an o-quinonediazido compound represented by formula (I):

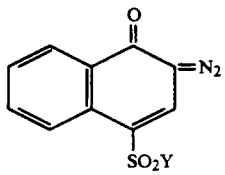

wherein Y constitutes a removable group, i.e. a group which is eliminated upon reaction between the o-quinonediazido compound and a novolac resin hydroxyl. The o-quinonediazido compound is reacted in an amount of about 4 to about 15 mole %, preferably in an amount of about 5 to about 10 mole % based on the theoretical molar level of hydroxyl groups in the resin. The moles of hydroxyls in the resin is calculated simply by dividing the mass of dry resin solids by 120, the molecular weight of the theoretical monomer repeat unit of the resin. Normally, the o-quinonediazido compound can be added in an amount of between about 10 to 20 weight %, based on the solvent-free weight of the resin. The group Y in the formula is one which is easily reactive with hydroxyls of the novolac resin and removable on reaction therewith. Examples are halogen atoms, an active imido group, and the like. A preferred o-quinonediazido compound is 1,2-naphthoquinonediazido(2)-4-sulfonylchloride.

The condensation of the novolac resin with the o-quinonediazido compound is effected in an organic solvent, such as acetone, cellosolve acetate, propylene glycol alkyl ether acetate and the like, or in a mixture of such solvents and in the presence of water, and an alkaline neutralization agent such as triethylamine, sodium carbonate, pyridine or the like. As was the case in preparing the novolac itself, it is preferred to use the same solvent which is ultimately used in preparing the photoresist composition. The condensation reaction proceeds at a relatively low temperature such as at room temperature or below and up to about 45° C. Excessive temperatures, e.g. above 100° C., are to be avoided as such temperatures tend to accelerate degradation of the photosensitive moiety.

In addition to the modified novolac resin, the improved resist composition of the present invention also includes a primary or secondary sulfonamide development enhancement agent. Suitable development enhancement agents can be selected from substituted and unsubstituted alkyl, aryl, and alkyl aryl sulfonamides. Suitable sulfonamides include those with formulae (II) and (III):

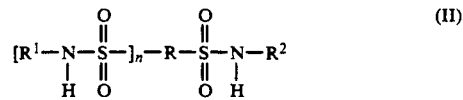

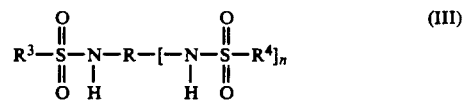

where n is 0 or 1 and R is a substituted or unsubstituted alkyl or alkylene of 1 to 6 carbon atoms, a substituted or unsubstituted aryl or arylene, such as phenyl or phenylene, naphthyl or naphthalene, tolyl or tolylene and xylyl or xylylene or a substituted or unsubstituted alkylaryl or alkylarylene such as benzyl or benzylidene and $R^1$ and $R^2$ can separately be a hydrogen, a substituted or unsubstituted alkyl of 1 to 6 carbon atoms, a substituted or unsubstituted aryl, such as phenyl, naphthyl, tolyl or xylyl or a substituted or unsubstituted alkylaryl such as benzyl, and $R^3$ and $R^4$ can separately be a substituted or unsubstituted alkyl of 1 to 6 carbon atoms, a substituted or unsubstituted aryl, such as phenyl, naphthyl, tolyl or xylyl or a substituted or unsubstituted alkylaryl such as benzyl. Suitable substituents include for example halogens, such as chlorine, and a nitro group. This class of development enhancement agents is particularly advantageous in combination with the modified novolac resin of the present invention.

The development enhancement agent is added to the photoresist composition in an amount between about 5 and 25 weight percent based on the modified novolac resin solids, preferably in an amount between about 7 and 15 weight percent. At this level of addition, a significant increase in the rate of development of the exposed resist is obtained, relative to an exposed resist of the same composition not containing the development enhancement agent. More importantly, it has been observed that over a certain developer concentration range (normality), there is substantially no difference in the dissolution characteristics between the non-exposed resist containing the development enhancement agent at this level of addition and the resist not containing it. Consequently, the photoresist composition of the present invention exhibits an enhanced contrast under such conditions.

Resist compositions according to the present invention also incorporate suitable additives and are coated onto the desired substrate usually in the form of liquid coating compositions. Additives can include actinic and contrast dyes, such as 4-(phenylazo)resorcinol and 2,3-Dihydro-6-methyl-1,4-dipropyl-1H-1,4-diazepinium Hexafluorophosphate(1-), anti-striation agents and plasticizers. Liquid coating compositions are formulated by preparing a mixture of the modified novolac resin, development enhancement agent and suitable additives and dissolving the mixture in a suitable solvent. A preferred solvent is one that evaporates at a suitable drying rate to give a uniform and smooth coating film. Such preferred solvents include ethyl cellosolve acetate, methyl cellosolve acetate, ethyl cellosolve, methyl cellosolve, propylene glycol monomethyl ether and propylene glycol monomethyl ether acetate, and their mixtures with butyl acetate, methyl isobutyl ketone, xylene and the like. The concentration of the photosensitive o-quinonediazido polymer in the solvent is, for example, 1 to 40% by weight, preferably 1 to 20% by weight.

Coating of the resist composition solution on a suitable substrate is accomplished in a known manner by spin or whirler-coating, spraying, dipping, rolling and the like. When spin coating, the solids content of the resist solution can be adjusted to a suitable level to yield a coating of the desired thickness.

After the resist composition solution is coated onto the substrate, the coated substrate is baked at an elevated temperature to remove solvent and fix the coating on the substrate. A coating thickness on the order of about one micron is typical. Times and temperatures typically used for the bake step in preparing prior art resists may advantageously be used in connection with the present invention. As recognized by those skilled in the art, the bake conditions depend in large part on the equipment and procedures employed. Temperatures generally range between about 75° C. and 100° C.

The resist composition now is ready for exposure to actinic radiation. The resist composition of the present invention is sensitive to ultraviolet radiation at a wavelength of between about 313 and 405 nanometers. After exposure, the resist coated substrate then is developed using a suitable developer solution. The present invention is particularly advantageous in that the exposed resist of the present invention is best developed using metal ion-free, alkaline developer solutions. Preferably, metal ion free developer solutions having a normality between about 0.13 and 0.17, preferably between 0.145 and 0.155, are used.

To the positive photoresist compositions obtained by the foregoing method, small amounts of resins, dyes, etc. may be added as additional ingredients as need arises. Also if desired, additional photo-sensitive agents can be added, such as the tris-naphthoquinonediazide photosensitizers known in the art.

The present invention will be described below in greater detail with reference to the examples, in which the parts and percentages are by weight unless otherwise indicated.

EXAMPLE 1

To a reactor equipped with an agitator, a reflux condenser and a cooling jacket is added 75 parts para-cresol, 1427 parts meta-cresol, 12 parts oxalic acid and 150 parts xylene. The reactor is heated to about 120° C. and then formaldehyde is gradually added, preferably subsurface, to the reactor. About 860 parts of a 37% formalin solution is added to the reactor over about a five hour period. After an additional 15 minutes at 120° C., the reactor temperature is increased to about 200° C., followed by a vacuum strip to remove essentially all volatile constituents from the reaction mixture.

After completing volatiles removal, the reaction mixture is prepared for the second reaction step by adding about 1600 parts propylene glycol methyl ether acetate to the reactor and adjusting the temperature to 145° C. Then, hexamethylenetetramine, in an amount of about 14 parts, is added to the reactor in five separate portions. Preferably, after each addition the GPC of the reaction mixture is monitored to assess how the molecular weight distribution of the reaction mixture is developing with reference to the desired distribution, such as for example the distribution shown in the sole figure. The time period between separate additions of the hexamethylenetetramine will be about three to four hours. Once the desired distribution is achieved, the resin solution is cooled and filtered. The resin now is ready for reaction with the o-quinonediazide compound.

EXAMPLE 2

A photoresist composition solution suitable for coating silicon wafer substrates is prepared from the resin of Example 1 by first reacting the resin with an o-quinonediazide. Approximately 16 parts 1,2-naphthoquinonediazido(2)-4-sulfonylchloride and 170 parts additional solvent are added with agitation to about 240 parts of a 43 percent solution of the resin of Example 1. The temperature is adjusted to about 40° C. and separate streams of water and a 50% solution of triethylamine in propylene glycol methyl ether acetate are fed into the reaction vessel over a one hour period. Approximately 80 parts water and 16 parts triethylamine solution are added. After a 90 minute reaction period, oxalic acid is added to neutralize excess amine, and about 100 parts acetone and 80 parts hexane are added to facilitate separation of the water soluble, by-product salts from the organic soluble, modified novolac resin. Following a one hour hold period, which allows the organic and aqueous phases to separate, the aqueous phase is removed. The organic fraction then is washed several times with a mixture of water, acetone and propylene glycol methyl ether acetate. Volatile constituents then are removed from the modified novolac resin by stripping under vacuum at a temperature of no higher than about 50°-55° C. It is important to remove any last traces of water in this step. After substantially all the water has been removed (e.g. below 0.1%), the residual modified novolac resin solution is filtered and additional propylene glycol methyl ether acetate solvent, meta-xylene-4,6-disulfonanilide (development enhancement agent), and an antistriation agent are added. The development enhancement agent is added in an amount of about 11% based on modified novolac resins solids. After thorough mixing and filtering, the resist composition solution is suitable for coating a substrate.

While certain specific embodiments of the invention have been described with particularity herein, it will be recognized that various modifications thereof will occur to those skilled in the art and it is to be understood that such modifications and variations are to be included within the purview of this application and the spirit and scope of the appended claims.

We claim:

1. A photosensitive resin comprising a reaction product of a cresol-formaldehyde novolac resin and a naphthoquinonediazide sensitizer represented by the following formula:

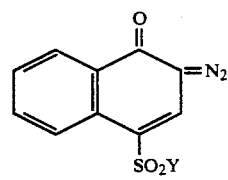

wherein Y constitutes a removable group which is eliminated upon reaction between the naphthoquinonediazide sensitizer and a hydroxyl group of the novolac resin, wherein said novolac resin is produced by condensing cresol with formaldehyde in the presence of an acid catalyst and reacting said condensate with hexamethylenetetramine.

2. The photosensitive resin of claim 1 wherein said cresol comprises a mixture of meta-cresol and para-cresol, having a meta to para isomer molar ratio of about 100:0 to 20:80.

3. The photosensitive resin of claim 1 wherein said cresolformaldehyde novolac resin has a molecular weight distribution such that it exhibits a gel permeation chromatography (GPC) pattern having an area ratio (based on the sum of the areas being 100%) as follows: a range A where the molecular weight range, calculated as polystyrene, is from about 200 to less than about 600 and constitutes from about 15 to about 25 area % of the GPC pattern, a range B where the molecular weight calculated as polystyrene is from about 600 to less than about 4500 and constitutes from about 40 to about 65 area % of the GPC pattern, a range C wherein the molecular weight calculated as polystyrene is from about 4500 to less than about 14500 and constitutes from about 10 to about 25 area % of the GPC pattern and a range D wherein the molecular weight calculated as polystyrene exceeds about 14500 and constitutes from about 2 to 10 area % with a further constant that the ratio of the sum of ranges A and B to the sum of the ranges C and D is between about 2.0 and 4.0.

4. The photosensitive resin of claim 3 wherein said GPC pattern is substantially that shown in the Figure.

5. The photosensitive resin of claim 1 wherein said removable group is a halogen or an imide group.

6. The photosensitive resin of claim 1 or 4 wherein said naphthoquinonediazide sensitizer is 1,2-naphthoquinonediazido (2)-4-sulfonylchloride.

7. A positive photoresist composition, comprising a mixture of
(a) about 95 to 80 percent by weight of a photosensitive resin comprising a reaction product of a cresol-formaldehyde novolac resin and a naphthoquinonediazide sensitizer represented by the following formula:

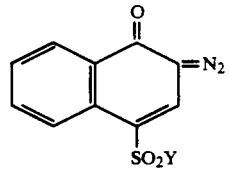

wherein Y constitutes a removable group which is eliminated upon reaction between the naphthoquinonediazide sensitizer and a hydroxyl group of the novolac resin, wherein said novolac resin is produced by condensing a cresol with formaldehyde in the presence of an acid catalyst and reacting said condensate with hexamethylenetetramine, and
(b) about 5 to 20 percent by weight of a primary or secondary sulfonamide development enhancement agent.

8. The positive photoresist composition of claim 7 wherein said cresol-formaldehyde novolac resin has a molecular weight distribution such that it exhibits a gel permeation chromatography (GPC) pattern having an area ratio (based on the sum of the areas being 100%) as follows: a range A where the molecular weight range, calculated as polystyrene, is from about 200 to less than about 600 and constitutes from about 15 to about 25 area % of the GPC pattern, a range B where the molecular weight calculated as polystyrene is from about 600 to less than about 4500 and constitutes from about 40 to about 65 area % of the GPC pattern, a range C wherein the molecular weight calculated as polystyrene is from about 4500 to less than about 14500 and constitutes from about 10 to about 25 area % of the GPC pattern and a range D wherein the molecular weight calculated as polystyrene exceeds about 14500 and constitutes from about 2 to 10 area % with a further constant that the ratio of the sum of ranges A and B to the sum of the ranges C and D is between about 2.0 and 4.0.

9. The photosensitive resin of claim 8 wherein said GPC pattern is substantially that shown in the Figure.

10. The positive photoresist composition of claim 7 wherein said removable group is a halogen or an imide group.

11. The positive photoresist composition of claim 7 or 9 wherein said naphthoquinonediazide sensitizer is 1,2-naphthoquinonediazido (2)-4-sulfonylchloride.

12. The positive photoresist composition of claim 7 wherein said cresol comprises a mixture of meta-cresol and para-cresol, having a meta to para isomer molar ratio of about 100:0 to 20:80.

13. The positive photoresist composition of claim 7 further containing an additive selected from actinic or contrast dyes, antistriation agents, plasticizers and mixtures thereof.

14. A composition suitable for forming a positive photoresist coating, said composition comprising a mixture of
(a) about 1 to 40 percent by weight of a photosensitive resin comprising a reaction product of a cresol-formaldehyde novolac resin and a naphthoquinonediazide sensitizer, represented by the following formula:

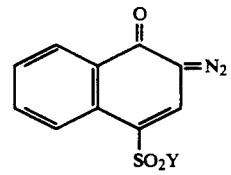

wherein Y constitutes a removable group which is eliminated upon reaction between the naphthoquinonediazide sensitizer and a hydroxyl group of the novolac resin, wherein said novolac resin is produced by condensing cresol with formaldehyde in the presence of an acid catalyst and reacting said condensate with hexamethylentetramine,
(b) about 0.05 to 10 percent by weight of a primary or secondary sulfonamide development enhancement agent and
(c) a solvent for (a) and (b).

15. The composition of claim 14 wherein said cresol-formaldehyde novolac resin has a molecular weight distribution such that it exhibits a gel permeation chromatography (GPC) pattern having an area ratio (based on the sum of the areas being 100%) as follows: a range A where the molecular weight range, calculated as polystyrene, is from about 200 to less than about 600 and constitutes from about 15 to about 25 area % of the GPC pattern, a range B where the molecular weight calculated as polystyrene is from about 600 to less than about 4500 and constitutes from about 40 to about 65 area % of the GPC pattern, a range C wherein the molecular weight calculated as polystyrene is from about 4500 to less than about 14500 and constitutes from about 10 to about 25 area % of the GPC pattern and a range D wherein the molecular weight calculated as polystyrene exceeds about 14500 and constitutes from about 2 to 10 area % with a further constant that the ratio of the sum of ranges A and B to the sum of the ranges C and D is between about 2.0 and 4.0.

16. The photosensitive resin of claim 15 wherein said GPC pattern is substantially that shown in the Figure.

17. The composition of claim 14 wherein said removable group is a halogen or an imide group.

18. The composition of claim 14 or 16 wherein said naphthoquinonediazide sensitizer is 1,2-naphthoquinonediazido (2)-4-sulfonylchloride.

19. The composition of claim 14 wherein said cresol comprises a mixture of meta-cresol and para-cresol, having a meta to para isomer molar ratio of about 100:0 to 20:80.

20. The composition of claim 14 further containing an additive selected from actinic or contrast dyes, antistriation agents, plasticizers and mixtures thereof.

21. A photosensitive element which comprises a substrate coated with the photosensitive resin of claim 1.

22. A photosensitive element which comprises a substrate coated with the positive photoresist composition of claim 7.

23. A photosensitive element which comprises a substrate coated with the composition of claim 14.

24. A photosensitive element which comprises a substrate coated with the photosensitive resin of claim 6.

25. A photosensitive element which comprises a substrate coated with the composition of claim 11.

26. The positive photoresist composition of claim 7 wherein said sulfonamide development enhancement agent has a formula (II) or (III):

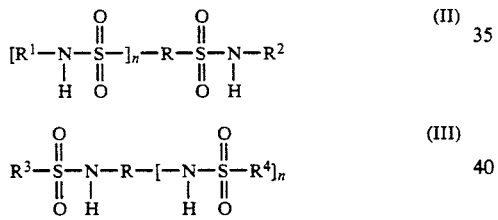

where n is 0 or 1 and R is a substituted or unsubstituted alkyl or alkylene of 1 to 6 carbon atoms, a substituted or unsubstituted aryl or arylene, or a substituted or unsubstituted alkylaryl or alkylarylene and $R^1$ and $R^2$, which can be the same or different, are a hydrogen, a substituted or unsubstituted alkyl of 1 to 6 carbon atoms, a substituted or unsubstituted aryl, or a substituted or unsubstituted alkylaryl and $R^3$ and $R^4$, which can be the same or different, are a substituted or unsubstituted alkyl, of 1 to 6 carbon atoms, a substituted or unsubstituted aryl, or a substituted or unsubstituted alkylaryl.

27. The composition of claim 14 wherein said sulfonamide development enhancement agent has a formula (II) or (III):

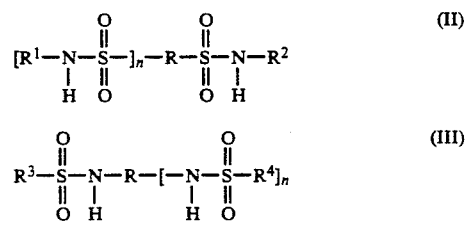

where n is 0 or 1 and R is a substituted or unsubstituted alkyl or alkylene of 1 to 6 carbon atoms, a substituted or unsubstituted aryl or arylene, or a substituted or unsubstituted alkylaryl or alkylarylene and $R^1$ and $R^2$, which can be the same or different, are a hydrogen, a substituted or unsubstituted alkyl of 1 to 6 carbon atoms, a substituted or unsubstituted aryl, or a substituted or unsubstituted alkylaryl and $R^3$ and $R^4$, which can be the same or different, are a substituted or unsubstituted alkyl of 1 to 6 carbon atoms, a substituted or unsubstituted aryl, or a substituted or unsubstituted alkylary.

28. The positive photoresist composition of claim 11 wherein said sulfonamide development enhancement agent has a formula (II) or (III):

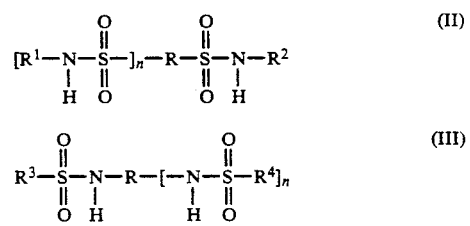

where n is 0 or 1 and R is a substituted or unsubstituted alkyl or alkylene of 1 to 6 carbon atoms, a substituted or unsubstituted aryl or arylene, or a substituted or unsubstituted alkylaryl or alkylarylene and $R^1$ and $R^2$, which can be the same or different, are a hydrogen, a substituted or unsubstituted alkyl of 1 to 6 carbon atoms, a substituted or unsubstituted aryl, or a substituted or unsubstituted alkylaryl and $R^3$ and $R^4$, which can be the same or different, are a substituted or unsubstituted alkyl of 1 to 6 carbon atoms, a substituted or unsubstituted aryl, or a substituted or unsubstituted alkylary.

29. The positive photoresist composition of claim 26 wherein said mixture contains said sulfonamide development enhancement agent in an amount of about 5 to 25 weight percent of the photosensitive resin.

30. The positive photoresist composition of claim 28 wherein said mixture contains said sulfonamide development enhancement agent in an amount of about 5 to 25 weight percent of the photosensitive resin.

31. A method for forming a photosensitive resist coated substrate which comprises coating said substrate with the composition of claim 14 and baking said coated substrate at an elevated temperature to remove solvent and fix the coating on the substrate.

32. A method for forming a photosensitive resist coated substrate which comprises coating said substrate with the composition of claim 16 and baking said coated substrate at an elevated temperature to remove solvent and fix the coating on the substrate.

33. A method for forming a photosensitive resist coated substrate which comprises coating said substrate with the composition of claim 18 and baking said coated substrate at an elevated temperature to remove solvent and fix the coating on the substrate.

34. A method for forming a photosensitive resist coated substrate which comprises coating said substrate with the composition of claim 20 and baking said coated substrate at an elevated temperature to remove solvent and fix the coating on the substrate.

35. The composition of claim 14 wherein said solvent is selected from butyl acetate, methyl isobutyl ketone, xylene, ethyl cellosolve acetate, methyl cellosolve acetate, ethyl cellosolve, methyl cellosolve, propylene glycol monomethyl ether and propylene glycol monomethyl ether acetate, and mixtures thereof.

36. The positive photoresist composition of claim 28 wherein said sulfonamide development enhancement agent is metaxylene-4,6-disulfonanilide.

37. A photosensitive element which comprises a substrate coated with the composition of claim 36.

* * * * *